(12) United States Patent
Lin

(10) Patent No.: US 7,540,745 B2
(45) Date of Patent: Jun. 2, 2009

(54) BURN-IN SOCKET HAVING PICK-UP ARRANGEMENT FOR QUICKLY PICK-UP IC PACKAGE AFTER IC PACKAGE IS TESTED

(75) Inventor: Wei-Chih Lin, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/156,072

(22) Filed: May 28, 2008

(65) Prior Publication Data

US 2008/0299793 A1    Dec. 4, 2008

(51) Int. Cl.
*H01R 13/44* (2006.01)
(52) U.S. Cl. .................. 439/73; 439/331; 439/940; 324/765; 324/158.1
(58) Field of Classification Search ............... 439/73, 439/331, 940, 525, 526; 324/765, 158.1
See application file for complete search history.

(56) References Cited

U.S. PATENT DOCUMENTS

| 5,247,250 | A |  | 9/1993 | Rios |
|---|---|---|---|---|
| 5,788,526 | A |  | 8/1998 | Twigg et al. |
| 6,083,013 | A |  | 7/2000 | Yamagishi |
| 6,152,755 | A | * | 11/2000 | Lee ............................. 439/327 |
| 6,297,654 | B1 | * | 10/2001 | Barabi ......................... 324/755 |
| 7,151,388 | B2 | * | 12/2006 | Gopal et al. ................. 324/765 |
| 7,429,182 | B1 | * | 9/2008 | Zheng et al. ................ 439/135 |
| 7,455,526 | B1 | * | 11/2008 | Ila et al. ....................... 439/41 |

FOREIGN PATENT DOCUMENTS

JP    H10-125426    5/1998

* cited by examiner

*Primary Examiner*—Gary F. Paumen
(74) *Attorney, Agent, or Firm*—Wei Te Chung

(57) ABSTRACT

A burn-in socket for receiving an IC package (2) is provided. The burn-in socket includes a socket body with a plurality of contacts (7) disposed therein and a cover (6) rotatably coupled to the socket body. The socket body defines a receiving space (500) for receiving the IC package (2) to be tested therein. The cover (6) has a pushing portion (611) capable of pressing on the IC package (2) toward the socket body when the cover (6) is turned to a closed position. At least one pair of pick-up arrangements (8) are provided around the pushing portion (611) for automatic pick-up of the IC package (2).

18 Claims, 6 Drawing Sheets

BURN-IN SOCKET HAVING PICK-UP ARRANGEMENT FOR QUICKLY PICK-UP IC PACKAGE AFTER IC PACKAGE IS TESTED

BACKGROUND OF THE INVENTION

1. Field of the Invention

This invention relates generally to a socket for removably loading and IC package having a plurality of solder balls in order to make an electrical connection with each contact, and more particularly, to a burn-in socket having a pick-up arrangement for quickly pick-up the IC package after the IC package is tested.

2. Description of the Related Art

IC packages are usually subjected to pass a so-called burn-in test, in which the IC packages are placed in an oven and operated for a time at an elevated temperature, e.g., 140 degrees C., and under a voltage source that is greater than the rated value; those IC packages that continue to perform satisfactorily are then approved for shipment.

A typical conventional socket which is used for receiving and testing an IC package is disclosed in Japanese patent application publication NO. 10-125426. Referring to FIG. 1, FIG. 5 and FIG. 6 of this patent application, this type of burn-in socket generally comprises a base 12 and a rotatable cover 62 hinged to the base 12. A platform 46 is provided upon the base for carrying an IC package (not shown in these figures). The cover 62 has a pusher 58 extending toward the base 12. When the cover 62 is turned to a closed position, the pusher 58 presses on the IC package, ready for a test to the IC package. The IC package is likely to rest on the platform 46 when the cover 62 is turned to an opened position after the test is completed, and needs to be picked up manually or by other automatic devices. Because some features or configurations for positioning the IC package are formed around the IC package, the pick-up of the IC package is not convenient, especially for manual operation.

BRIEF SUMMARY OF THE INVENTION

Accordingly, it is an object of the present invention to provide an burn-in socket that reaches automatic pick-up for an IC package.

According to one aspect of the present invention, a burn-in socket for receiving an IC package is provided. The burn-in socket includes a socket body with a plurality of contacts disposed therein and a cover rotatablely coupled to the socket body. The socket body defines a receiving space for receiving the IC package to be tested therein. The cover has a pushing portion capable of pressing on the IC package toward the socket body when the cover is turned to a closed position. At least one pair of pick-up arrangements are provided on the pushing portion for automatic pick-up of the IC package when the cover is rotated to an opened position from its closed position.

According to another aspect of the present invention, a burn-in socket for receiving an IC package is provided. The burn-in socket includes a socket body with a plurality of contacts disposed therein and a cover rotatablely coupled to the socket body. The socket body defines a receiving space for receiving the IC package to be tested therein. The cover has a pushing portion capable of pressing on the IC package toward the socket body when the cover is turned to a closed position. At least one pair of clips are provided on the pushing portion for clipping the IC package, and spring elements are also provided for respectively biasing with the clips, so as to reliably keep the IC package between the pair of the clips.

Other objects, advantages and novel features of the present invention will become more apparent from the following detailed description of the present embodiment when taken in conjunction with the accompanying drawings.

DETAILED DESCRIPTION OF THE INVENTION

Figure 1:
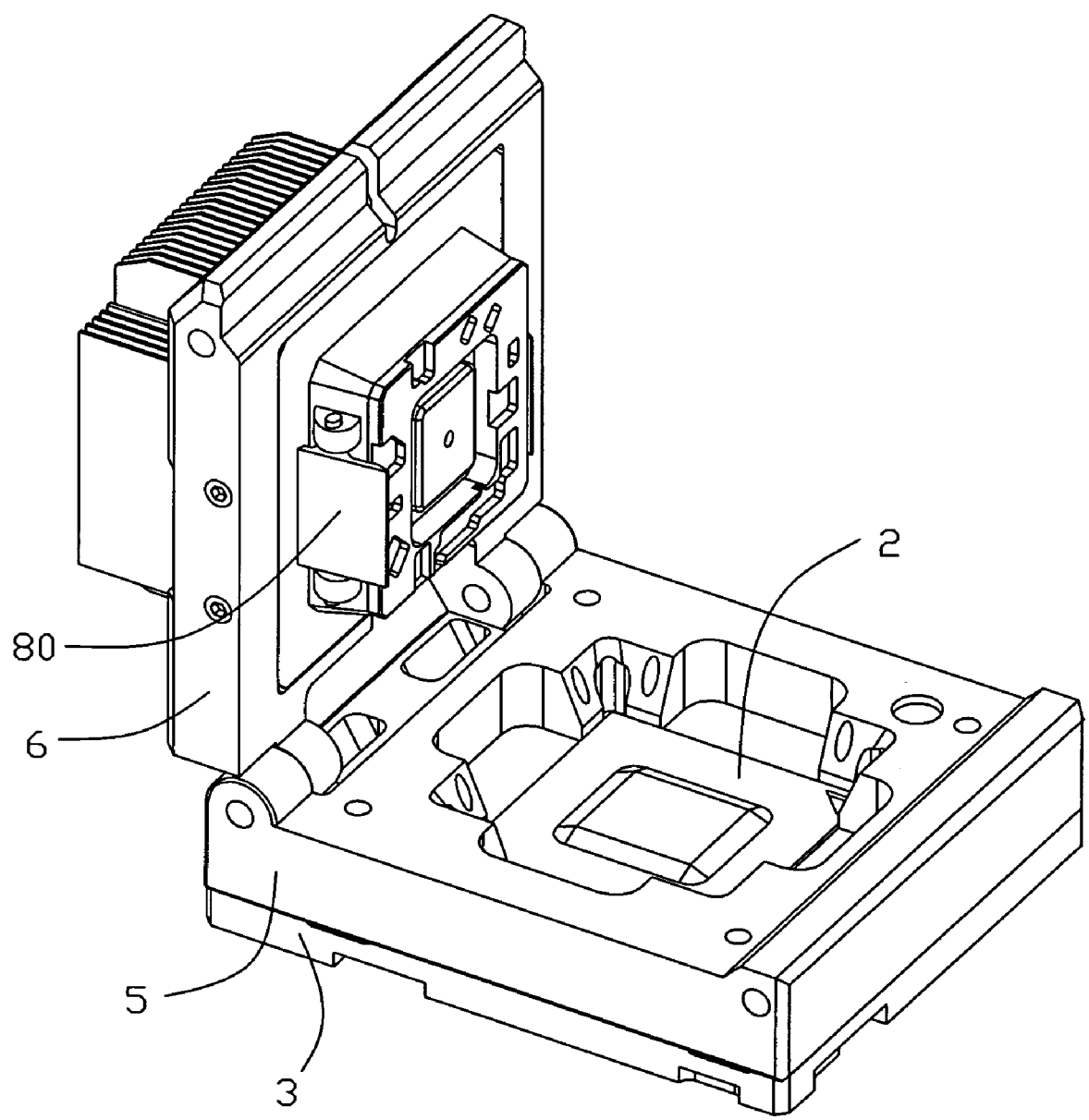
FIG. 1 is an assembled, perspective view of a burn-in socket according to an embodiment of the present invention.
Figure 2:
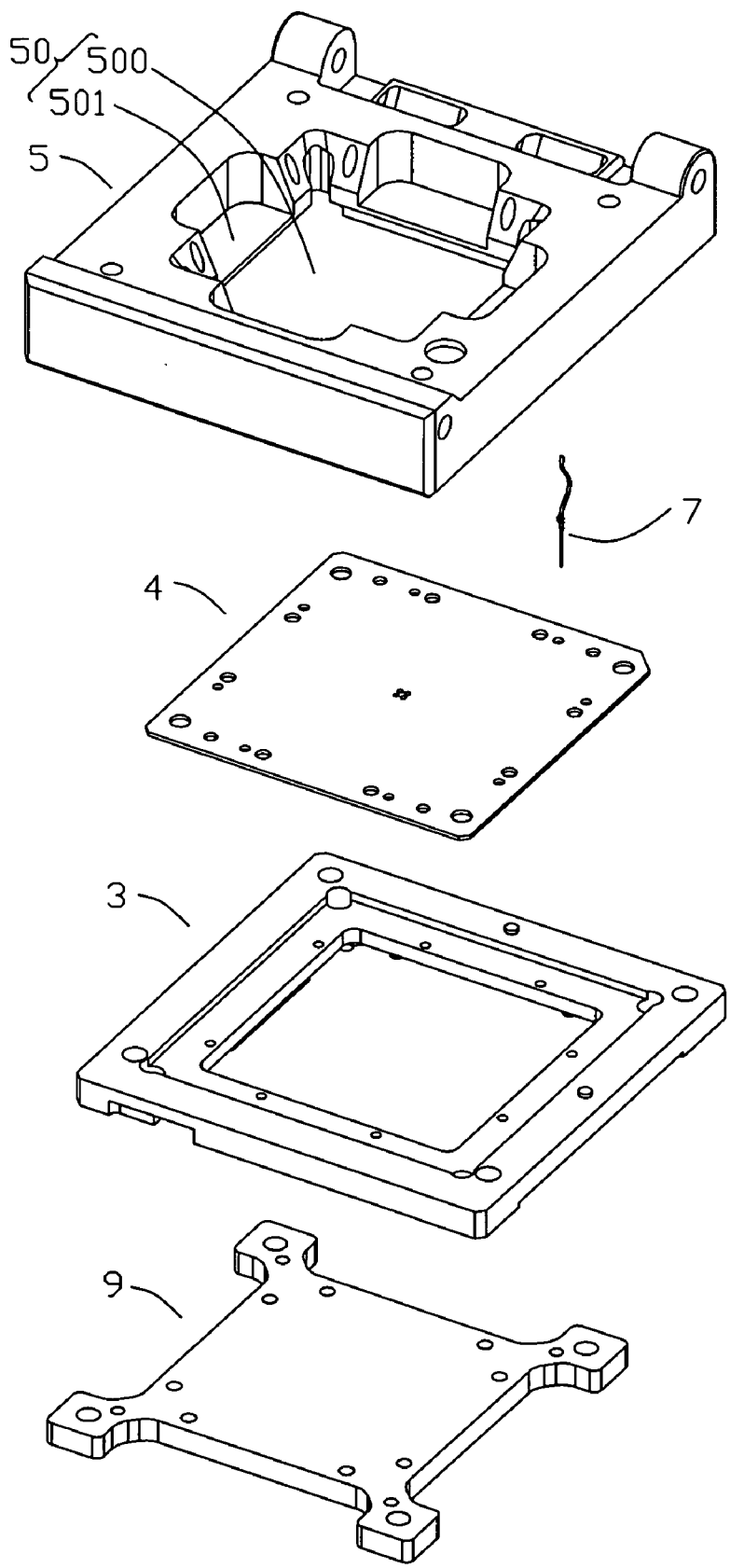
FIG. 2 is an exploded, perspective view of a socket body according to the embodiment of the present invention.
Figure 3:
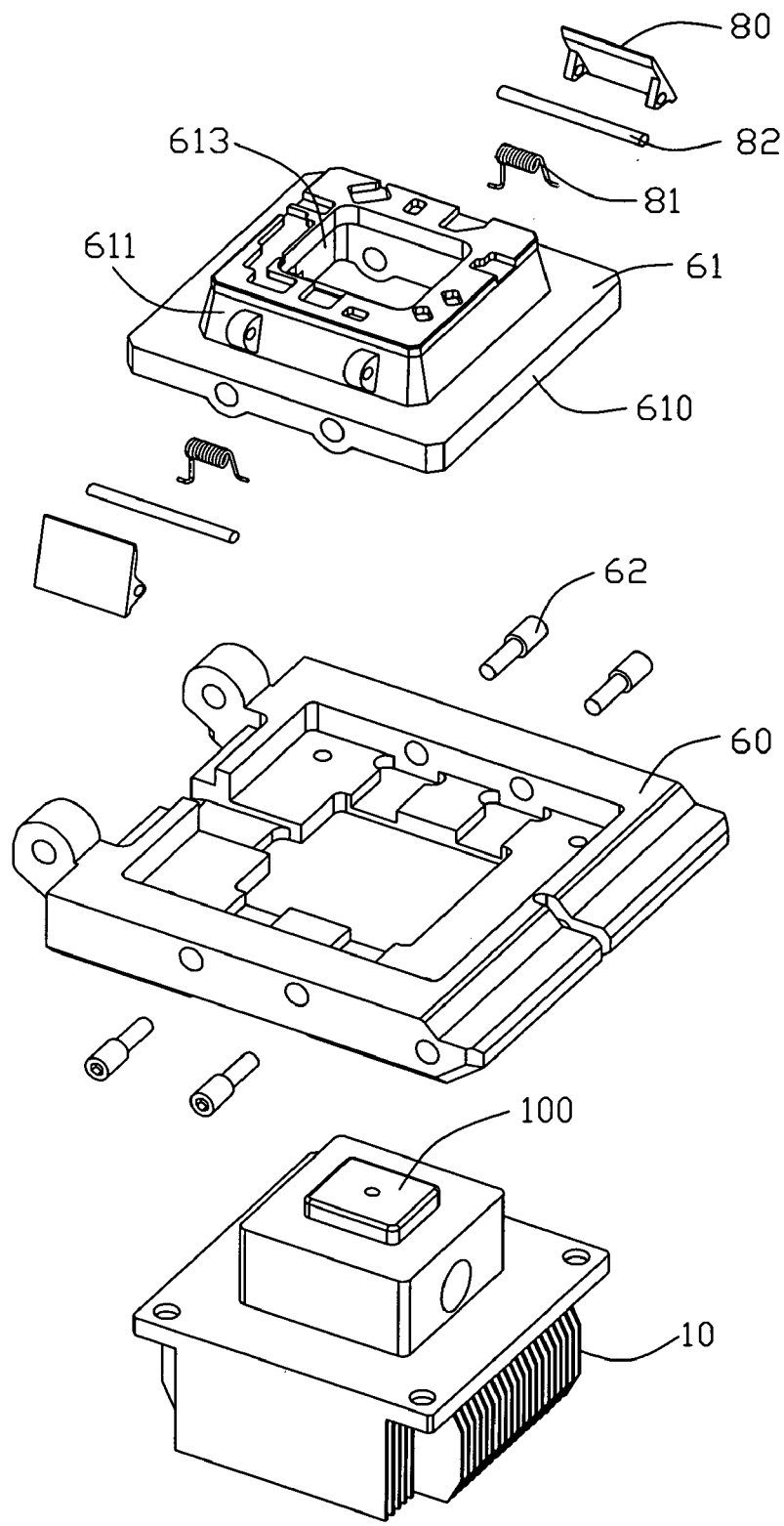
FIG. 3 is an exploded, perspective view of a cover according to the embodiment of the present invention.
Figure 4:
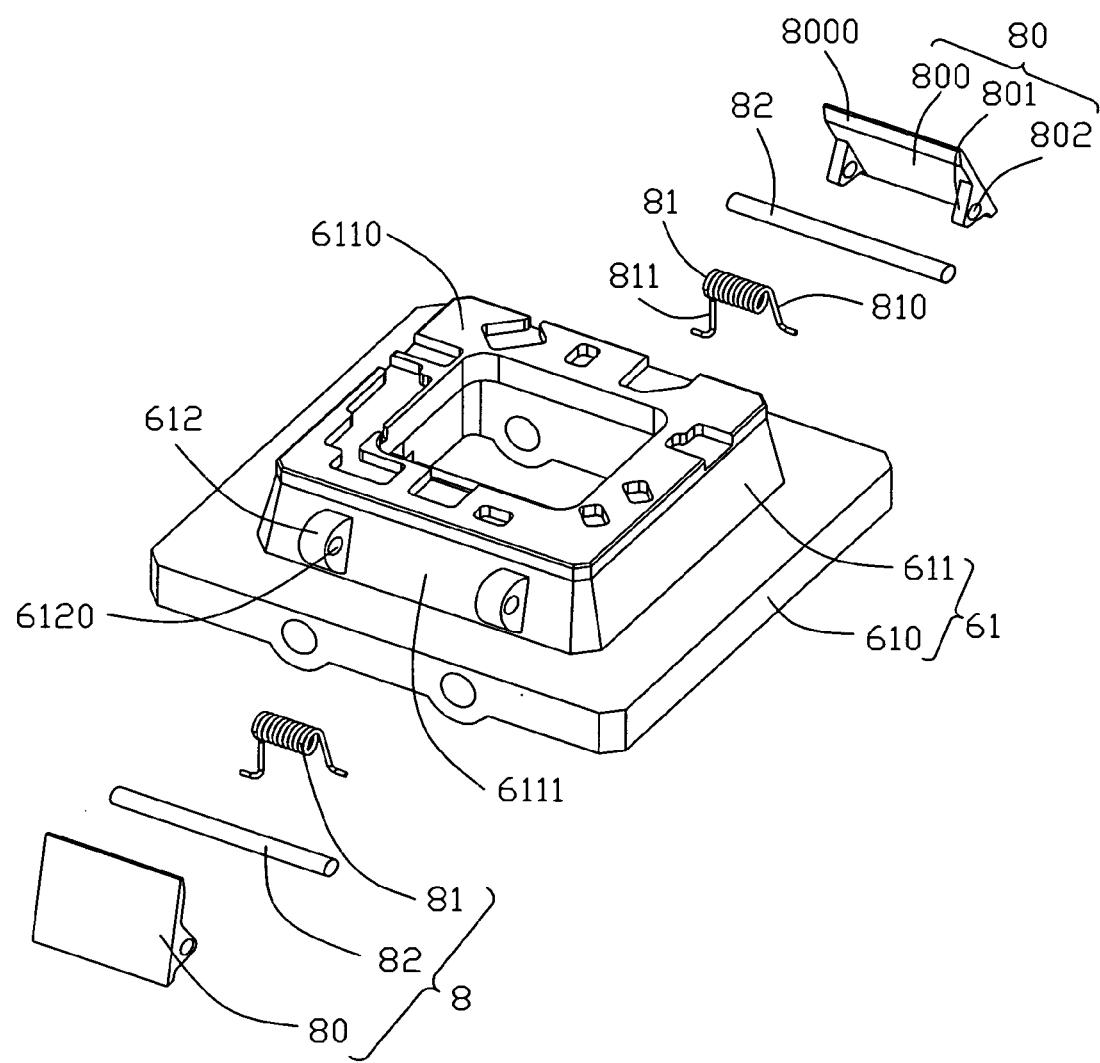
FIG. 4 is an exploded, perspective view of a pushing body and a pair of pick-up arrangements according to the embodiment of the present invention.
Figure 5:
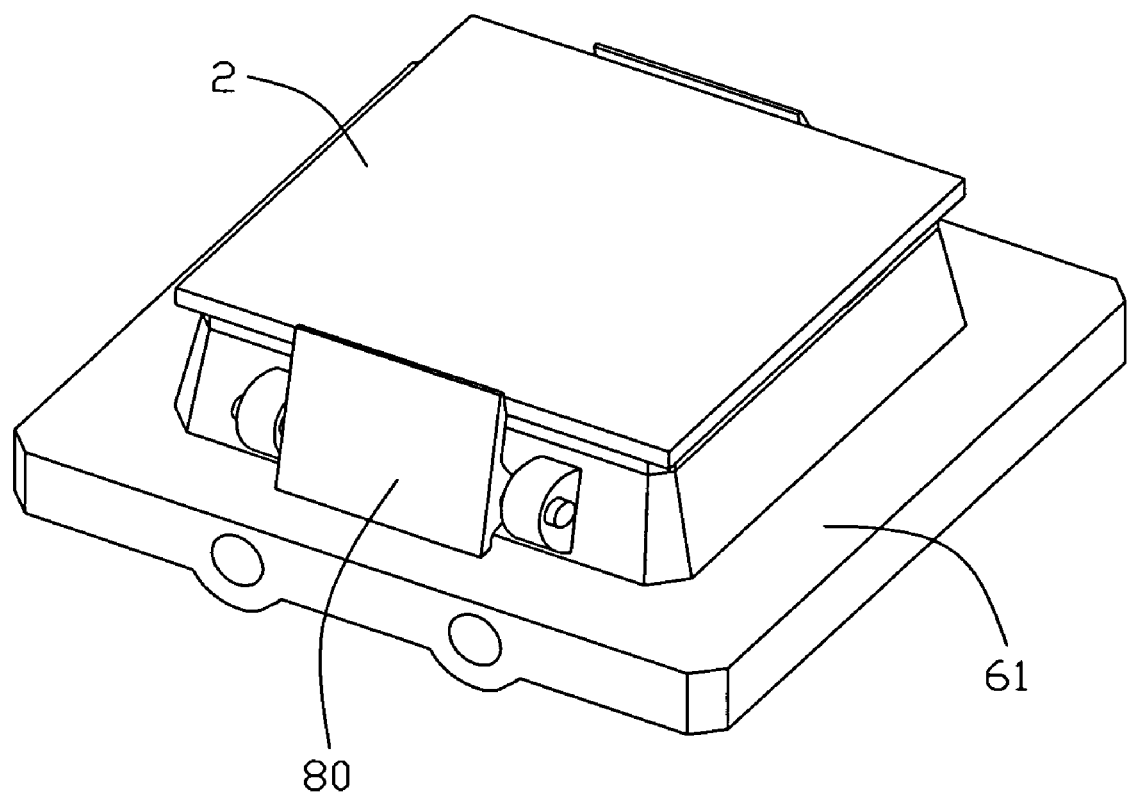
FIG. 5 is an assembled, perspective view of the pushing body, with the pick-up arrangements clipping an IC package according to the embodiment of the present invention.
Figure 6:
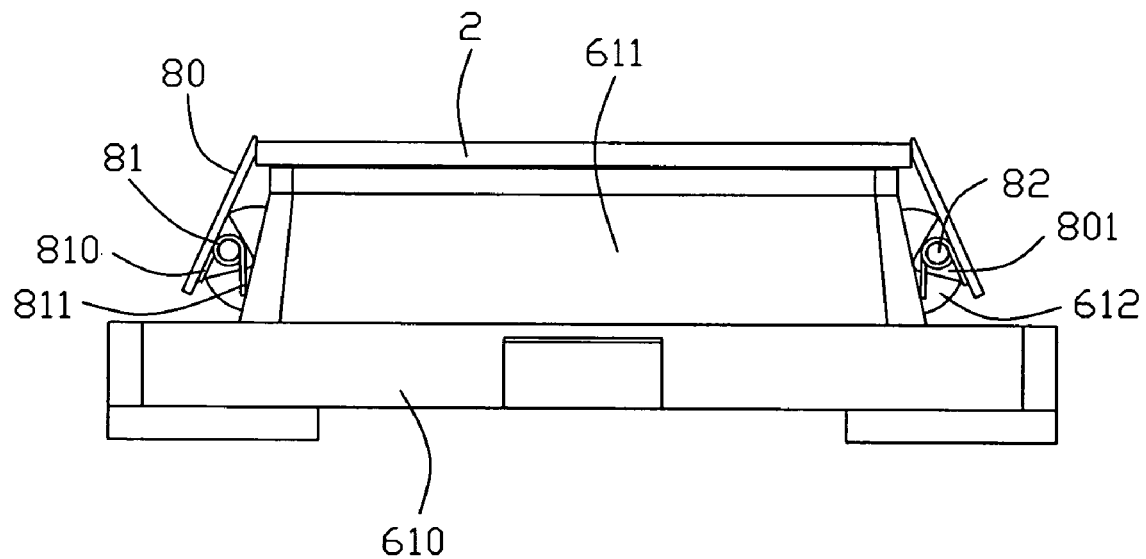
FIG. 6 is lateral view of FIG. 5.

The burn-in socket 1 of the present invention is generally mounted on a printed circuit board (not shown) for connecting an IC package 2. Referring to FIG. 1 to FIG. 6, the burn-in socket 1 mainly includes a socket body with a plurality of contacts 7 disposed therein and a cover 6 rotatablely coupled to the socket body. The socket body includes a base 3, a retaining plate 4 mounted within the base 3 for receiving the contacts 7, and a receptacle 5 above the base 3.

The base 3 has a rectangular configuration, with an opening (not labeled) formed in a middle position. A bottom plate 9 is placed at the bottom of the socket body.

The receptacle 5 is located above the base 3, and is formed with a cavity 50, which further includes a receiving space 500 for accommodation of the IC package 2 and an operation space 501 at the periphery of the receiving space 500, providing convenience for pick-up of the IC package 2.

The cover 6 is rotatablely coupled to the socket body by pivotally connecting to the receptacle 5, and is able to be turned from an opened position (shown in FIG. 1) to a closed position, where the cover 6 covers on the receptacle 5. The cover 6 includes a frame 60 and a pushing body 61 fixed in the middle of the frame 60 by four screws 62. The pushing body 61 further includes a main portion 610 and a pushing portion 611 extending at a middle position from the main portion 610. The pushing portion 611 is configured with a substantial prismoid structure and composed of four side walls 6111 and a pressing surface 6110 that faces toward the IC package loaded in the receiving space when the cover is placed in the closed position. One pair of opposite side walls 6111 is respectively integrally formed with two retainers 612. Each of the retainers 612 has a perforation 6120. Further, a rectangular opening 613 is made to extend though the pushing body 61 along a vertical direction. The pushing portion 611 is substantially located into the receiving space 500 when the cover 6 is rotated to a closed position.

A pair of pick-up arrangements 8 are provided at two opposite side walls 6111, where the retainers 612 are located. Each of the pick-up arrangements 8 includes a clip 80, a torsion spring 81 biasing with the clip 80, and a rod 82 for combining the clip 80 and the torsion spring 81. The clip 80 constitutes of a plate portion 800 and a pair of connecting portions 801, which are respectively equipped with a perforation 802. The plate portion 800 is formed with a wedge portion 8000 at a front edge. The wedge portion 8000 extends beyond the pressing surface 6110 along a direction toward the socket body, so as to earliestly touch edges (not labeled) of the IC package 2 and make the IC package 2 attached to the pressing surface 6110. During the assembling process, the clip 80 and the torsion spring 81 are firstly positioned between the two retainers 612 on the side wall 6111 of the pushing body 61, then the rod 82 passes through corresponding perforations 802, 6120. The torsion spring 81 encloses the rod 82, with one end 811 abutting against the plate portion 800 of the clip 80 and the other end abutting against the side wall 6111.

Further, a heat sink 10 is mounted onto the cover 6 for heat dissipation. The heat sink 10 has a touching surface 100 located in the rectangular opening 613 for contact with the IC package 2.

The clip 80 abuts against the pushing portion 611 by a slight elastic force of the torsion spring 81 in an initial state, when the cover 6 is placed in an opened position. Putting the IC package 2 into the receiving space 500, the electrical connection between the IC package 2 and the contacts 7 could be reached. The pushing portion 611 moves toward into the cavity 50 during the rotation of the cover 6 to the closed position, until the touching surface 100 comes into touch the IC package 2. The pair of the pick-up arrangements 8 respectively moves into corresponding operation space 501, and two clips 80 of the pick-up arrangements 8 together clipping the IC package 2 and reliably keep the IC package 2 therebetween, by the elastic force generated by the torsion spring 81. The wedges 8000 which earliestly come into touch edges of the IC package 2 enable the clips 80 to easily finish the clipping operation. The clip 80 rotates during the clipping step because of the engagement with the IC package 2, and therefore torsion deformation happens to the torsion spring 81. Elastic force is therefore generated and urges the clip apparatuses 8 to clip the IC package 2 firmly and ensures a fine clipping effect.

The IC package 2 clipped by the pick-up arrangements 8, is to move automatically together with the cover 6, and automatic pick-up of the IC package 2 is hence reached during the cover 6 is rotated to the opened position. Then the IC package 2 could be taken down from the pick-up arrangements 8 by manual operation or automatic operation of a machine.

Above is the description of the best embodiment of present invention. Further, some structures or means could be replaced by others, for example, an integral cover could be used to take place the cover in the best embodiment, which is composed of two elements. Further, it's also feasible to use four pick-up arrangements around the pushing portion, to clip the IC package, and a better effect could be reached.

What is claimed is:

1. An burn-in socket for receiving an IC package comprising:
   a socket body with a plurality of contacts disposed therein, said socket body defining a receiving space for receiving the IC package to be tested therein;
   a cover rotatably coupled to said socket body, the cover having a pushing portion capable of pressing on the IC package toward the socket body when the cover is turned to a closed position; and
   at least one pair of pick-up arrangements provided on the pushing portion for automatic pick-up of the IC package when the cover is rotated to an opened position from its closed position after the test of the IC package is completed.

2. The burn-in socket according to claim 1, wherein each pick-up arrangement includes a clip and a spring element biasing with the clip.

3. The burn-in socket according to claim 2, wherein said spring element is a type of torsion spring, and is formed with one end abutting with the clip, and the other end abutting with the pushing portion.

4. The burn-in socket according to claim 3, wherein a rod is provided for combining the clip and the torsion spring, and the torsion spring encloses the rod.

5. The burn-in socket according to claim 2, wherein the clip has a plate portion formed with a wedge at a front edge, which earliestly comes into touch edges of the IC package.

6. The burn-in socket according to claim 1, wherein the cover includes a pushing body and a frame, and said pushing portion is integrally formed from the pushing body.

7. The burn-in socket according to claim 6, wherein the pushing portion is composed of a pressing surface and four side walls, and said pick-up arrangements are respectively located at the side walls.

8. The burn-in socket according to claim 1, wherein the socket body includes a base, a retaining plate mounted within the base for receiving the contacts, and a receptacle above the base.

9. An burn-in socket for receiving an IC package comprising:
   a socket body with a plurality of contacts disposed therein, said socket body defining a receiving space for the IC package;
   a cover rotatably coupled to said socket body, the cove having a pushing portion capable of pressing the IC package when the cover is turned to a closed position;
   at least one pair of clips provided around the pushing portion for clipping the IC package; and
   spring elements respectively biasing with the clips, so as to reliably keep the IC package between said pair of the clips.

10. The burn-in socket according to claim 9, wherein the IC package moves together with the cover when the cover is turned to an opened position.

11. The burn-in socket according to claim 10, wherein said spring element is a type of torsion spring, and is formed with one end abutting with the clip, and the other end abutting with the pushing portion.

12. The burn-in socket according to claim 11, wherein a rod is provided for combining the clip and the torsion spring, and the torsion spring encloses the rod.

13. The burn-in socket according to claim 12, wherein the clip has a plate portion formed with a wedge, which earliestly comes into touch edges of the IC package.

14. The burn-in socket according to claim 9, wherein the cover includes a pushing body and a frame, and said pushing portion is integrally formed from the pushing body.

15. The burn-in socket according to claim 14, wherein the pushing portion is composed of a pressing surface and four side walls and said pick-up arrangements are respectively located at the side walls.

16. The burn-in socket according to claim 9, wherein the socket body includes a base, a retaining plate mounted within the base for receiving the contacts, and a receptacle above the base.

17. An burn-in socket for receiving an IC package comprising:
 a socket body with a plurality of contacts disposed therein, said socket body defining a receiving space for the IC package;
 a cover rotatablely coupled to said socket body, the cover having a pressing surface facing toward the IC package loaded in the receiving space when the cover is placed in a closed position;
 at least one pair of clips attached to the cover, each clip having a wedge extending beyond the pressing surface along a direction toward the IC package, so as to clipping the IC package and make it attached to the pressing surface.

18. The burn-in socket according to claim 17, spring elements are provided for respectively biasing with the clips, so as to reliably keep the IC package between said pair of the clips.

* * * * *